United States Patent [19]
Daughton et al.

[11] Patent Number: 5,729,137
[45] Date of Patent: Mar. 17, 1998

[54] MAGNETIC FIELD SENSORS INDIVIDUALIZED FIELD REDUCERS

[75] Inventors: James M. Daughton, Edina; Theodore M. Hermann, Eden Prairie, both of Minn.

[73] Assignee: Nonvolatile Electronics, Incorporated, Eden Prairie, Minn.

[21] Appl. No.: 735,218

[22] Filed: Oct. 22, 1996

[51] Int. Cl.⁶ .............................. G01R 33/09; H01L 43/00
[52] U.S. Cl. ........................ 324/252; 324/225; 338/32 R
[58] Field of Search ............................. 324/207.21, 252, 324/225; 338/32 R; 360/113; 365/158

[56] References Cited

U.S. PATENT DOCUMENTS

| | | | |
|---|---|---|---|
| 4,097,802 | 6/1978 | Mahopac | 324/252 |
| 5,119,025 | 6/1992 | Smith et al. | 324/252 |
| 5,260,653 | 11/1993 | Smith et al. | 324/252 |
| 5,434,733 | 7/1995 | Hesterman et al. | 360/113 |
| 5,442,508 | 8/1995 | Smith | 360/113 |
| 5,477,482 | 12/1995 | Prinz | 365/129 |
| 5,569,544 | 10/1996 | Daughton | 428/611 |

*Primary Examiner*—Gerard R. Strecker
*Attorney, Agent, or Firm*—Kinney & Lange, P.A.

[57] ABSTRACT

A magnetic field sensor having a plurality of interconnected magnetoresistive magnetic field sensing structures with at least one thereof having a permeable material mass adjacent thereto to shield it from externally applied magnetic fields. Another has a shunting structure adjacent a side thereof to remove a fraction of externally applied magnetic fields from affecting same.

10 Claims, 7 Drawing Sheets

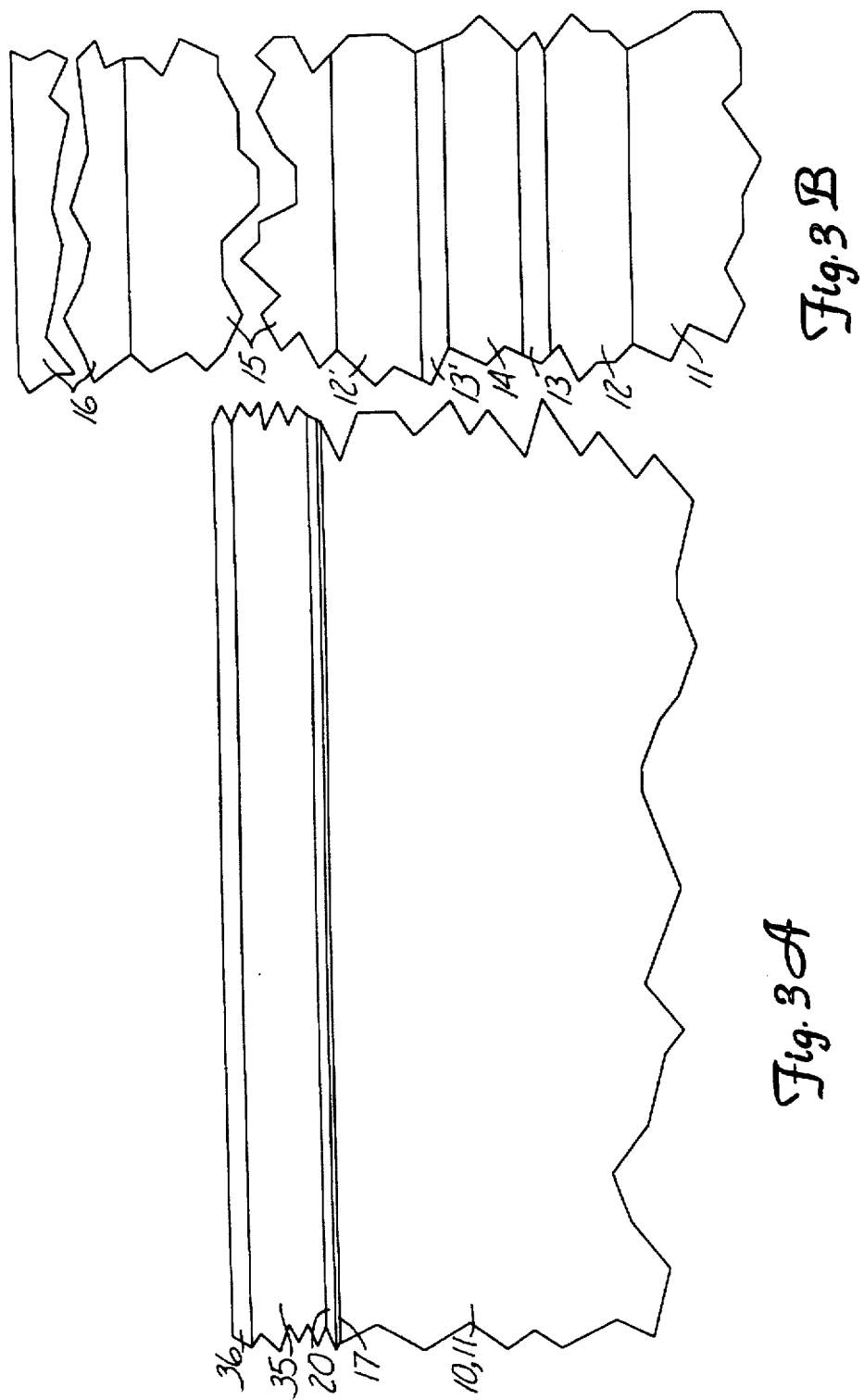

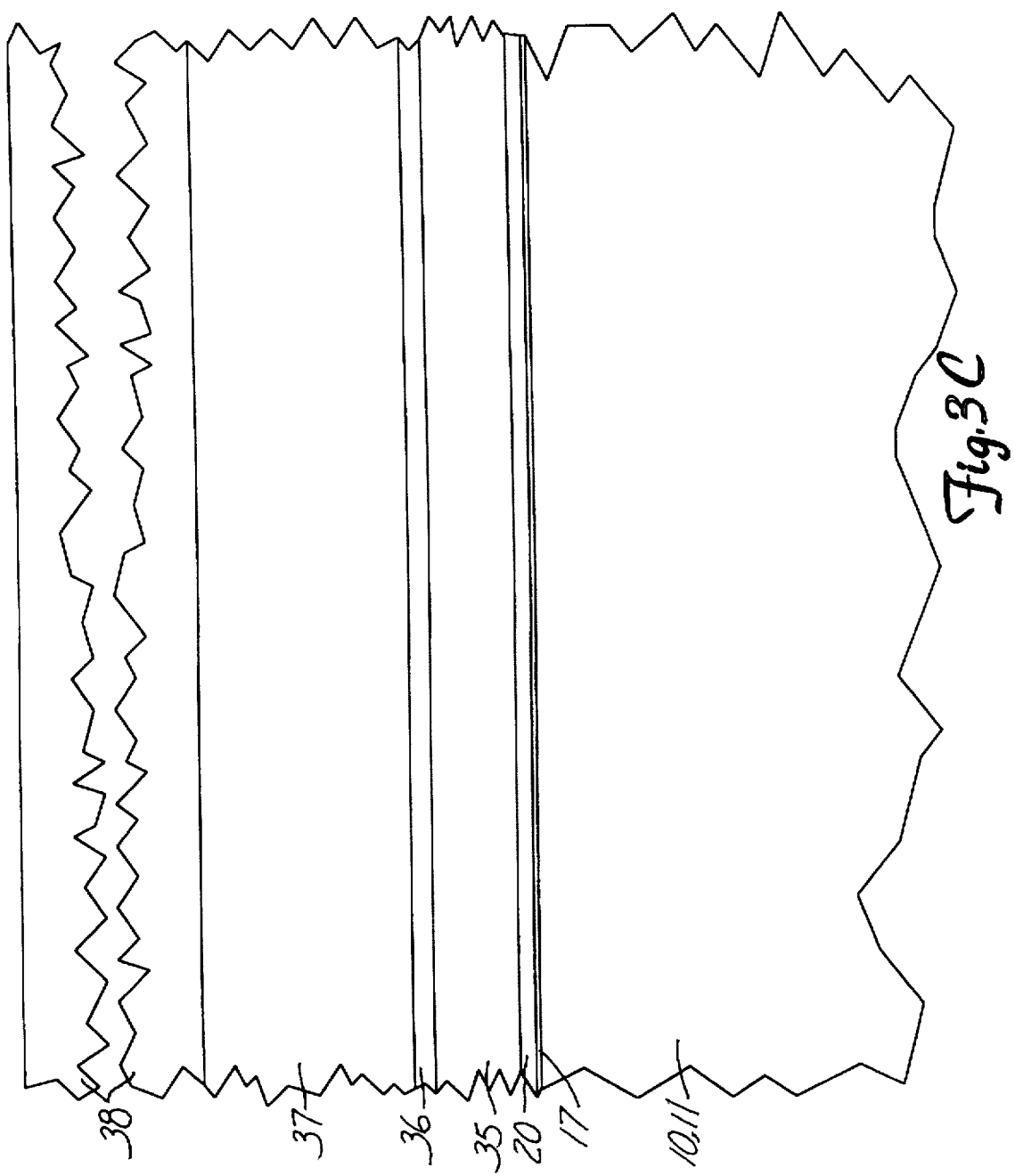

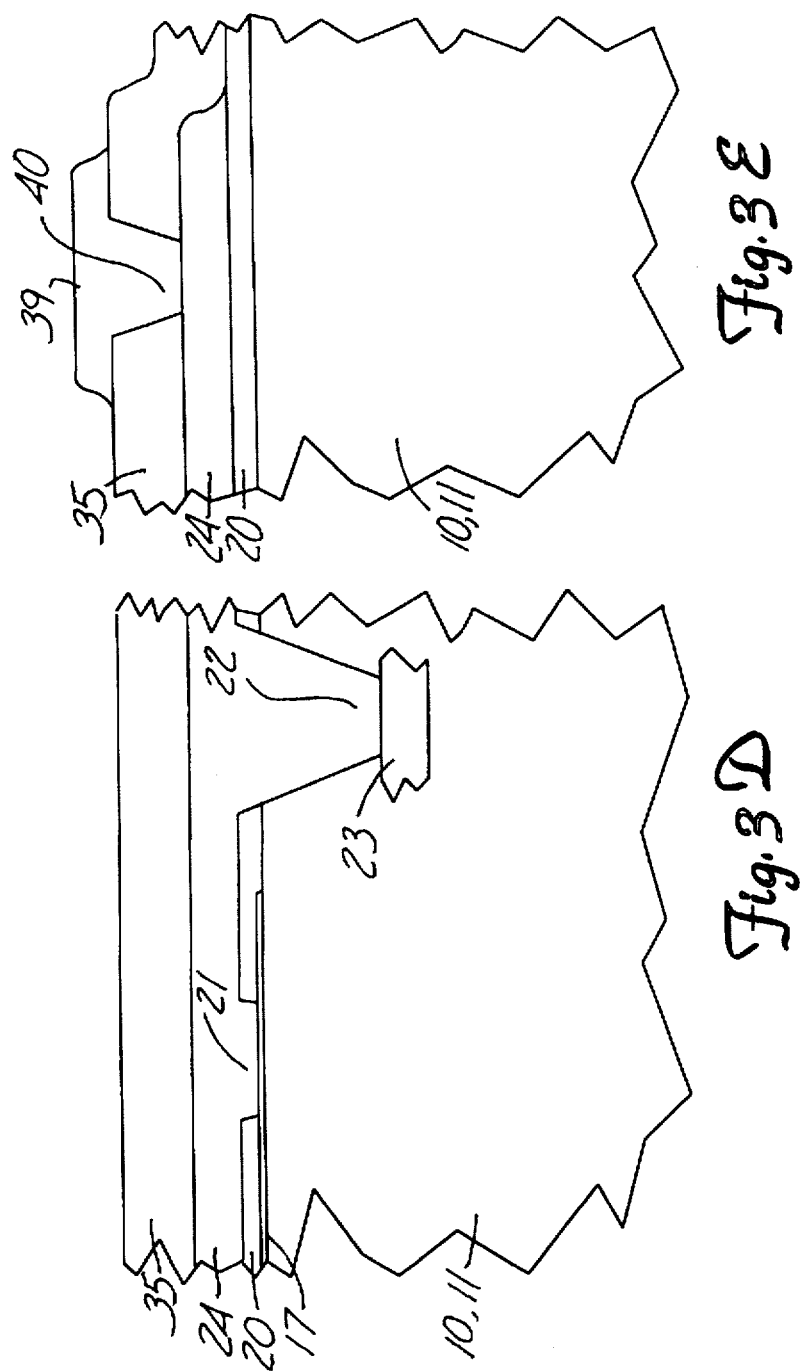

MAGNETIC FIELD SENSORS INDIVIDUALIZED FIELD REDUCERS

BACKGROUND OF THE INVENTION

The present invention relates to ferromagnetic thin-film structures exhibiting relatively large magnetoresistive characteristics and, more particularly, to such structures used to sense magnetic fields.

Many kinds of electronic systems make use of magnetic devices including both digital systems, such as memories, and analog systems such as field sensors. Magnetometers and other magnetic sensing devices are used extensively in many kinds of systems including magnetic disk memories and magnetic tape storage systems of various kinds. Such devices provide output signals representing the magnetic field sensed thereby in a variety of situations.

Such sensors can often be advantageously fabricated using ferromagnetic thin-film materials, and are often based on magnetoresistive sensing of magnetic conditions therein. Such devices may be provided on a surface of a monolithic integrated circuit to provide convenient electrical connections between the device and the operating circuitry therefor in the integrated circuit.

Such ferromagnetic thin-film sensors can be made very small when so constructed. Such sensors are often provided in the form of an intermediate separating material having two major surfaces on each of which an anisotropic ferromagnetic thin-film is provided. In such "sandwich" structures, reducing the thicknesses of the ferromagnetic thin-films in the intermediate layer has been shown to lead to a "giant magnetoresistive effect" being present. This effect can be enhanced by having additional alternating ones of such films and layers, i.e. superlattices. This effect can yield a magnetoresistive response which can be in the range of up to an order of magnitude greater than that due to the well-known anisotropic magnetoresistive response.

In the ordinary anisotropic magnetoresistive response in ferromagnetic thin-films, varying differences between the direction of the magnetization vector in such a thin-film and the direction of a sensing current passed through that film leads to varying differences in the effective electrical resistance of the film in the direction of the current. The maximum electrical resistance occurs when the magnetization vector in the film and the current direction are parallel to one another, while the minimum resistance occurs when they are perpendicular to one another. The total electrical resistance of such a magnetoresistive ferromagnetic thin-film exhibiting this response can be shown to be given by a constant value, representing the minimum resistance, plus an additional value depending on the angle between the current direction in the film and the magnetization vector therein. This additional resistance follows a square of the cosine of that angle.

As a result, operating external magnetic fields can be used to vary the angle of the magnetization vector in such a film portion with respect to the easy axis of that film portion, which axis comes about because of an anisotropy therein typically resulting from depositing the film in the presence of a fabrication external magnetic field oriented in the plane of the film along the direction desired for the easy axis in the resulting film. During subsequent operation of a sensing device using the resulting film, such operating external magnetic fields can vary the magnetization vector angle to such an extent as to cause switching of that film magnetization vector between two stable states which occur as magnetizations oriented in opposite directions along that easy axis. The state of the magnetization vector in such a film portion can be measured, or sensed, by the change in resistance encountered by a current directed through this film portion.

In contrast to this arrangement, the resistance in the plane of a ferromagnetic thin-film is isotropic with respect to the giant magnetoresistive effect rather than depending on the direction of a sensing current therethrough as for the anisotropic magnetoresistive effect. The giant magnetoresistive effect has a magnetization dependent component of resistance that varies as the cosine of the angle between the magnetizations in the two ferromagnetic thin-films on either side of the intermediate layer. In the giant magnetoresistive effect, the electrical resistance through the "sandwich" or superlattice is lower if the magnetizations in the two separated ferromagnetic thin-films are parallel than it is if these magnetizations are antiparallel, i.e. oriented in opposing directions. Further, the anisotropic magnetoresistive effect in very thin films is considerably reduced from the bulk values therefor in thicker films due to surface scattering, whereas very thin films are a fundamental requirement to obtain a significant giant magnetoresistive effect. The total electrical resistance in such a magnetoresistive ferromagnetic thin-film "sandwich" structure can be shown again be given by a constant value, representing the minimum resistance, plus an additional value depending on the angle between the magnetization vectors in the two films as indicated above.

A measured resistance characteristic versus the magnitude of an externally applied magnetic field is shown for such a device in FIG. 1. In fact, two such characteristics are shown in that figure for the magnetization vectors of the ferromagnetic layers therein pointing in the opposite directions at zero applied field, one characteristic for each of the two possible directions of magnitude change in the externally applied magnetic field due to hysteresis in the magnetic thin-films. As can be seen, such externally applied magnetic fields cannot be sensed by the sensor represented in these curves for those fields having absolute magnitudes exceeding approximately 40.0 Oe, i.e. the applied field has saturated the sensing capability of the sensor at these magnitudes.

However, the use of such giant magnetoresistive effect sensors is desired for sensing fields having greater magnitudes. Such sensors in the form of a superlattice rather than a "sandwich" structure can be used in such a situation since they can be constructed to saturate at fields having absolute values of from 200 to 1000 Oe or higher. Such superlattice sensors are, in fact, often used with flux concentrators to reduce the field at which the sensor saturates so as to increase the sensitivity thereof.

However, such superlattice sensors do not withstand higher temperatures very well because of the use of thinner intermediate layers to improve the sensitivity thereof. At higher temperatures, the sensitivity of such a superlattice structure can be permanently reduced probably due to migration of materials in the intermediate and ferromagnetic layers. Thus, there is a desire for a "sandwich" structure sensor having a higher field saturation value.

SUMMARY OF THE INVENTION

The present invention provides a magnetic field sensor involving at least two sensing structures provided in an arrangement which permits one of those sensing structures to sense magnetic fields having a higher absolute value than that structure could sense in the absence of being provided in such a structural arrangement. The sensing structures are provided on a substrate as "sandwich" structures electrically connected to one another and to an interconnection arrangement suited for connection to a source of electrical energy. A shield permeable material mass is provided over one of the sensing structures, and a shunt permeable material mass is provided beside the remaining one of these sensing structures to thereby permit only a fraction of the magnitudes of externally applied magnetic fields to affect this shunt adjacent sensing structure by shunting part of such an applied field therearound. Such a shunt permeable material mass can be provided as a layer over the adjacent sensing structure or as a full or partial enclosure around such a sensing structure to thereby direct portions of an externally applied field away therefrom. Such a shunting permeable material mass can be provided as one of a plurality of such material masses to thereby permit selecting the magnetic field effects due thereto to some degree if desired.

BRIEF DESCRIPTION OF THE DRAWINGS

FIGS. 3A, 3B, 3C, 3D and 3E show layer views of portions of the structure shown in FIGS. 2A and 2B.

DETAILED DESCRIPTION OF THE PREFERRED EMBODIMENTS

As indicated above, magnetic field sensors, based on magnetoresistive sensing of magnetic conditions occurring therein, can be advantageously fabricated using ferromagnetic thin-film materials. Such devices may be provided on a surface of a monolithic integrated circuit to thereby allow providing convenient electrical connections between the sensor device and the operating circuitry therefor provided in that integrated circuit.

These field sensors are provided in the form of an intermediate thin layer of a separating material having two major surfaces on each of which an anisotropic ferromagnetic thin-film is positioned. This "sandwich" structure, again as indicated above, leads to a "giant magnetoresistive effect" in the sensor if the thicknesses of the ferromagnetic thin-films in the intermediate layer in such a structure have been made sufficiently small in thickness. Sensors similar to those described herein for sensing magnetic fields generated externally with respect to those monolithic integrated circuit structure devices containing such sensors are described in earlier filed co-pending applications by J. M. Daughton entitled Magnetoresistive Structure Comprising Ferromagnetic Thin Films and Intermediate Alloy Layer Having Magnetic Concentrator and Shielding Permeable Masses having U.S. Pat. No. 5,617,071 and "Magnetic Structure with Stratified Layers" having Ser. No. 08/096,765 both assigned to the same assignee as the present application and hereby incorporated herein by reference.

Figure 1:
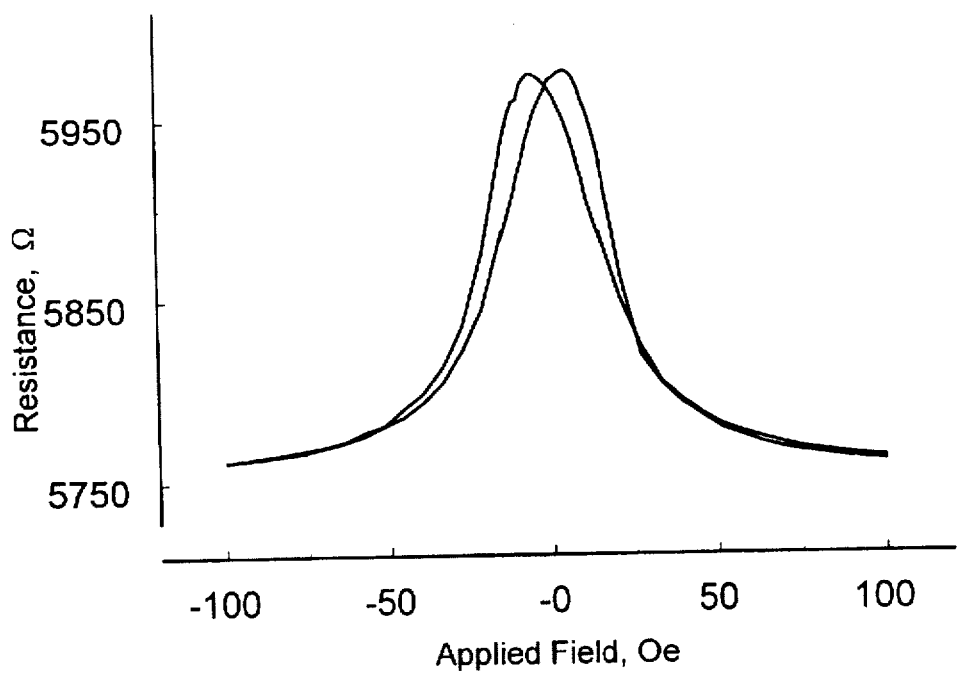
FIG. 1 shows a graph of a characteristic of a magnetic field sensing structure.

Such sensors are typically formed using a bridge circuit comprising a plurality of sensing structures as indicated in the foregoing applications. Often, some of the sensing structures in the bridge circuit are used as reference structures to provide parameters of the sensing structures free of the effects of externally applied magnetic fields, and so are shielded by permeable material masses from any such externally applied magnetic fields. The sensing structures that are not shielded each typically has a resistance versus the externally applied magnetic field characteristic similar to that shown in FIG. 1. As indicated above, such a sensing structure saturates, or reaches its minimum resistance value, at magnetic fields having absolute value magnitudes that are too small for the sensing of magnetic fields over a suitable range in some situations.

However, the absolute values of the magnetic field magnitudes at saturation can be increased significantly by providing a shunting permeable material mass at a side of the unshielded sensing structures to in effect subtract a portion of the externally applied magnetic field so as to result in only a fraction of that applied field affecting the unshielded sensing structures. Since, in these circumstances, a greater externally applied magnetic field would then be needed to overcome the shunting effect to saturate a sensing structure, the desired result of a larger saturation field is thereby achieved.

On the other hand, such shunting will result in a resistance versus the externally applied magnetic field characteristic having a "dead zone" located about the zero applied external field point. Hence, such a shunted sensing structure will not exhibit very good linearity in its resistance characteristic with respect to externally applied fields even though it now saturates in such applied fields at greater absolute value magnitudes.

Figure 2A:
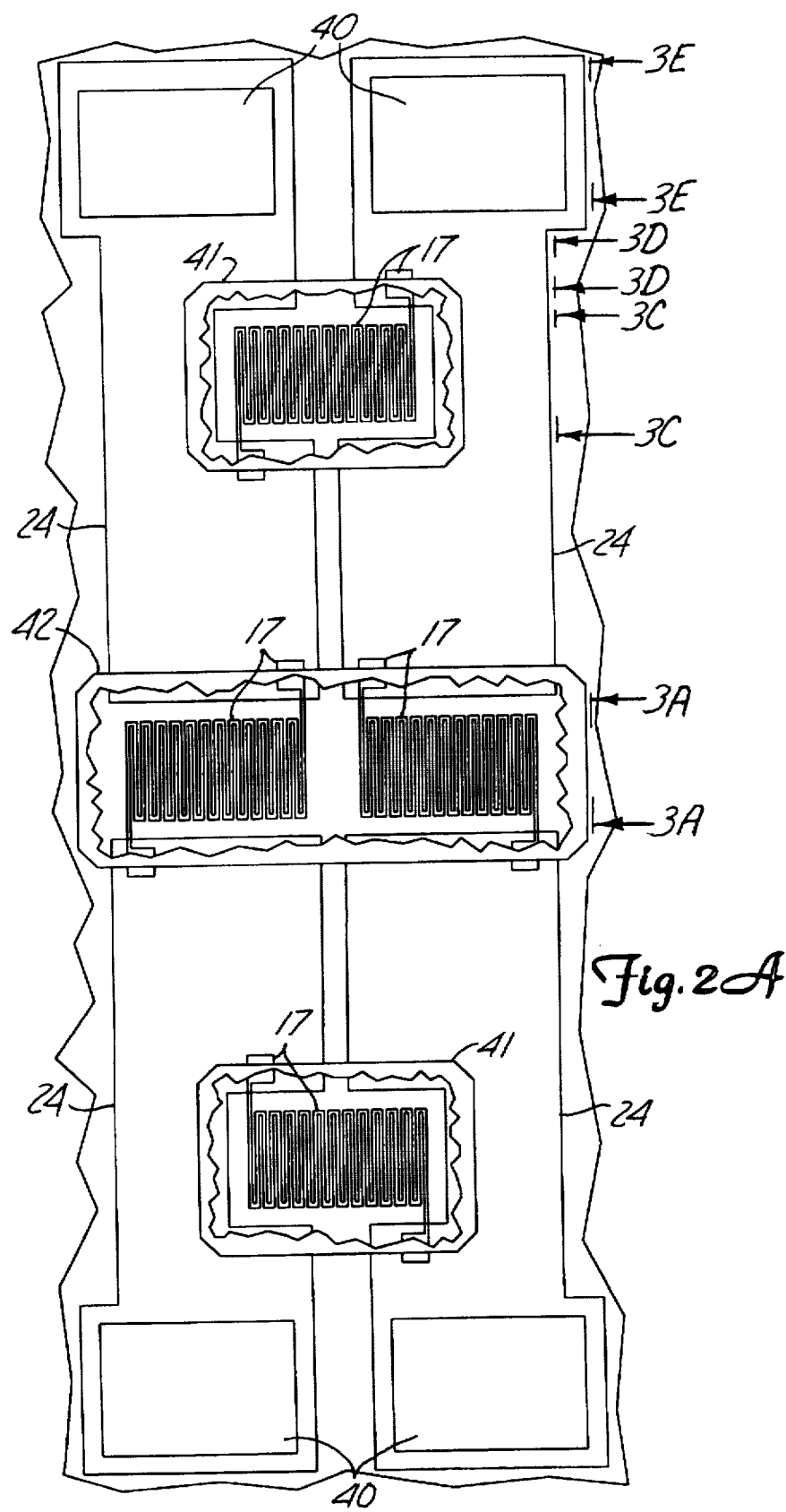
FIGS. 2A, 2B and 2C show plan views of alternative magnetic field sensing structures embodying the present invention.

FIG. 2A shows a plan view of a sensor having four such sensing structures formed in a bridge circuit as a part of a monolithic integrated circuit which includes a supporting semiconductor chip as pan of the sensor substrate that can have conveniently provided therein the operating circuitry for this sensor. Alternatively, the sensor could be formed as part of a hybrid integrated circuit on a ceramic substrate. The optional protective layer that is provided over the structure shown as used has been omitted in this view for clarity as have some other layers so that the structure portions are shown in solid line form. The sensing structures in the figure are the four serpentine extended length structures each having interconnection pads at the opposite ends of their extents which pads are shown in this view beneath other structures but have not been placed in dashed line form where so covered.

Corresponding to FIG. 2A are FIGS. 3A, 3B, 3C, 3D and 3E which are layer diagrams of corresponding portions of the structure shown in FIG. 2A as marked in that figure. These layer diagrams give an indication of the structural layers leading to the structure shown in FIG. 2A but are not true cross-section views in that many dimensions are exaggerated or reduced for purposes of clarity.

As is indicated above, the magnetic field sensor of FIG. 2A has the sensing structures therein typically provided on a semiconductor chip, 10, having suitable operating circuitry for the sensor provided therein as indicated in FIGS. 3A, 3B, 3C, 3D and 3E. An electrical insulating layer, 11, formed on semiconductor chip 10 by sputter depositions of silicon nitride (or perhaps capped with 20 to 40 Å of tantalum), is shown in these figures supporting a magnetic field sensing "sandwich" structure comprising a pair of ferromagnetic thin-film layers that are separated from one another by a non-magnetic, electrically conductive intermediate layer as will be described in more detail below. The substrate for the magnetic field sensor formed of semiconductor chip 10 and support layer 11 is designed 10,11 in FIGS. 3A, 3C, 3D and 3E as insulating layer 11 and semiconductor chip 10 are not distinguished from one another in those figures. A portion of just layer 11 is shown in the higher resolution, or enlarged partial view, drawing of FIG. 3B. Typically, layer 11 is formed by the silicon nitride to a thickness of about 10,000 Å.

Thereafter, the "sandwich" structures mentioned above are provided on layer 11 with each of the ferromagnetic thin-film layers and the intermediate layer therein being provided through sputter deposition as the basis for forming the magnetoresistive circuit resistors serving as the magnetic field sensing structures in the bridge circuit forming the magnetic field sensor of FIG. 2A. These multilayer structures will each have a sheet resistivity of approximately 13 $\Omega/\square$, or higher, and will exhibit a giant magnetoresistive effect exceeding 3% along with a saturation field of approximately 40 Oe considering the sensing structures by themselves without the presence of adjacent permeable materials.

In such sensing structures, the first layer provided is a composite ferromagnetic thin-film layer sputter deposited onto nitride layer 11 with the result shown in FIG. 3B. A first stratum, 12, of this composite ferromagnetic thin-film layer is formed of an alloy of 65% nickel, 15% iron and 20% cobalt to a thickness of 40 Å which will have a magnetic saturation induction of typically about 10,000 Gauss. The deposition of this layer occurs in the presence of an external magnetic field in the plane of the film oriented along a direction parallel to the plane of the figure which results in the film having a face-centered cubic structure. This fabrication field will leave an easy axis also directed along the plane of the figure. A second stratum, 13, in the composite layer is also provided by sputter deposition in the presence of a similar fabrication magnetic field. This second stratum is formed of 5% iron and 95% cobalt to a thickness of 15 Å resulting in this material having a magnetic saturation induction of approximately 16,000 Gauss which is a value higher than that of the magnetic saturation induction of first stratum 12. This higher magnetic saturation induction material 13 is provided adjacent the intermediate layer, to be formed next, to obtain a greater giant magnetoresistive effect, but with lower saturation induction stratum 12 being provided to keep the resulting magnetic field sensing structure more sensitive to smaller fields than it would be in the absence of layer 12.

Thereafter, an intermediate layer, 14, is provided by sputter deposition onto layer 13, this intermediate layer being electrically conductive but non-magnetic. Layer 14 is typically formed of copper to a thickness of 35 Å. The provision of layer 14 is followed by forming a second composite ferromagnetic thin-film layer that is provided on layer 14, and its structure matches that of the first composite layer comprising strata 12 and 13, except for being reverse order, because of the repeated use of the same deposition steps therefor. As a result, the stratum having the greater magnetic saturation induction is again adjacent the layer 14, and the lesser magnetic saturation induction stratum is provided thereon. Since the strata are otherwise the same as those in the first composite layer, they have been designated in FIG. 3B as 13' and 12' in corresponding to strata 13 and 12.

After completing this "sandwich" structure, a 200 Å layer of tantalum or tantalum nitride is sputter deposited on stratum 12' to passivate and protect stratum 12' below, and to allow electrical interconnection thereto for circuit purposes. The resulting layer, 15, of tantalum or tantalum nitride, because of its conductivity, leads to the occurrence of some shunting away of electrical current from the rest of the sensing structure which unavoidably results in some effective reduction of the giant magnetoresistive effect achieved by the so constructed magnetic field sensing structure. Layer 15 is shown in broken form in FIG. 3B because of its significantly greater thickness compared to the ferromagnetic composite layers and the non-magnetic intermediate layer.

Figure 2B:
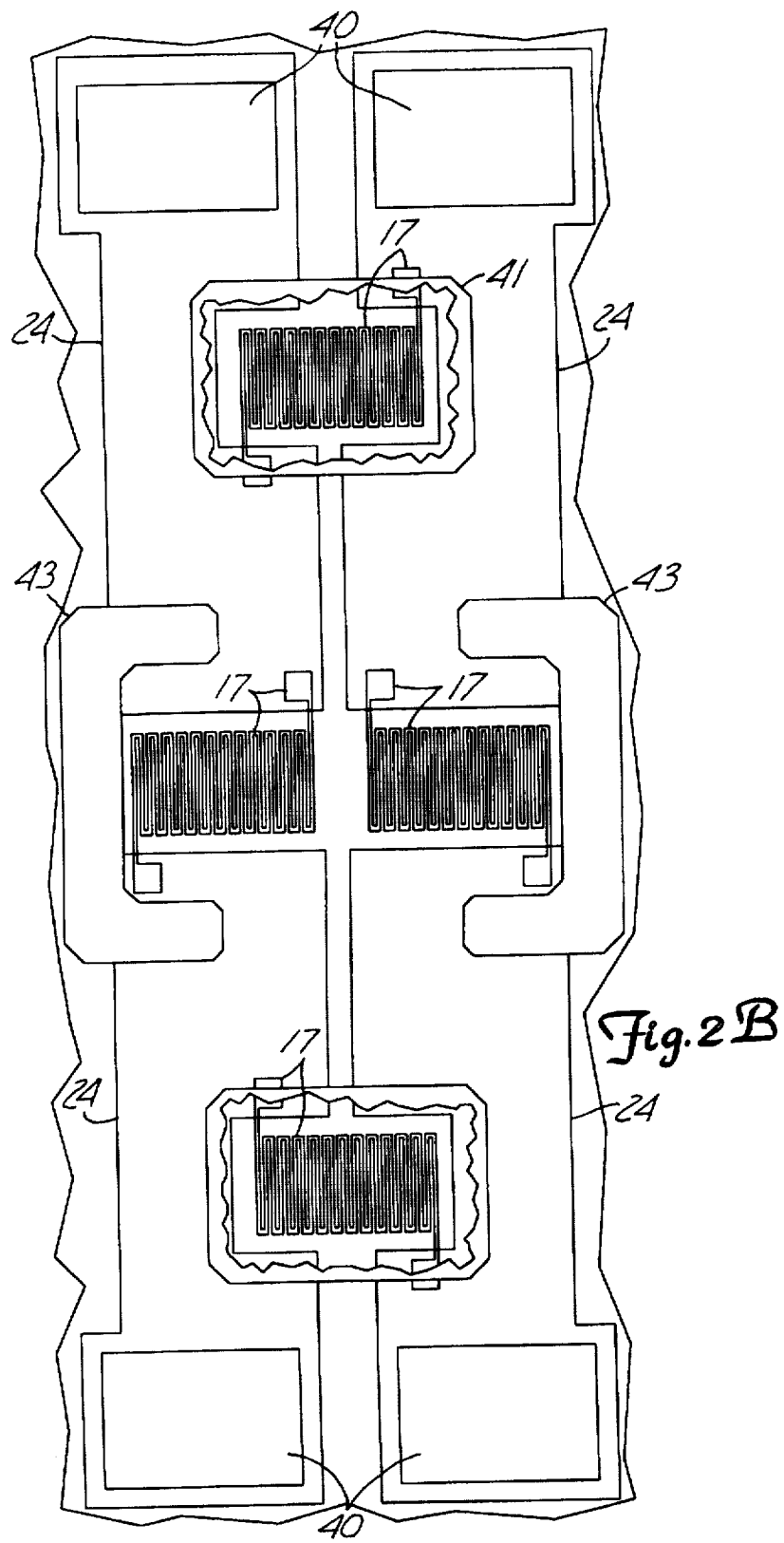

Similarly, a further layer, 16, deposited on layer 15, is also shown in broken form in FIG. 2B because of its relatively greater thickness of 100 Å. Layer 15 is first sputter cleaned prior to the deposition of layer 16 which cleaning removes around 75 Å thereof. Layer 16 is then sputter deposited on cleaned layer 15 as a chrome silicon layer with 40% chrome and 60% silicon to serve as an etch stop for the subsequent etching of a milling mask layer to be provided thereover. To this end, another layer of silicon nitride is sputter deposited on layer 16 to a depth of 1000 Å to be used as a milling mask, but this layer is not shown in FIG. 3B because its remnants will be incorporated in a further insulating layer to be provided later. On this silicon nitride mask layer, photoresist is deposited and patterned in such a way as to form an etching mask for leaving a desired masking pattern on the silicon nitride mask layer after the etching of this photoresist. This last pattern is to result, after milling therethrough, in providing the four serpentine resistor structures to serve as the magnetic field sensing structures with interconnections extending therefrom to the others to form a bridge circuit and for interconnecting the resulting bridge circuit into the device circuit network in and on the substrate.

Reactive ion etching is used with the patterned photoresist to remove the exposed portions of the silicon nitride mask layer to chrome silicon layer 16 serving as an etch stop. The remaining portions of the silicon nitride layers serve as the above mentioned milling mask for the subsequent ion milling step which removes the exposed portions of chrome silicon layer 16, and then removes the resulting exposed portions of the second composite ferromagnetic thin-film layer formed as strata 13' and 12', and then removes the thereafter exposed portions of intermediate non-magnetic layer 14, and then finally removes the subsequently exposed portions of the first composite ferromagnetic thin-film layer formed as strata 13 and 12 down to silicon nitride layer 11.

The resulting, following the milling, magnetic field sensing structures and the corresponding interconnection structures, 17, are shown as a single layer structure where they appear in the layer diagram figures, other than in FIG. 3B, rather than as the multilayer structure shown in FIG. 3B that they actually are because of the larger scale used in these other figures. Thus, in this single layer form, the resulting magnetic field sensing structures 17 are shown in each of FIGS. 3A, 3C and 3D. These field sensing structures can also be seen in the plan view of FIG. 2A where these structures are designated by numeral 17 also. The easy axis of the ferromagnetic thin-film composite layers are perpendicular to the direction of extent of the longest segments of the magnetic field sensing structures 17.

Following completion of magnetic field sensing structures and interconnection structures 17, an insulating layer, 20, of 1500 Å of silicon nitride or more is provided by sputter deposition over structures 17 (including over the remnants of the silicon nitride milling layer which are shown combined in this insulating layer in FIGS. 3A, 3C and 3D (and on the exposed portions of silicon nitride layer 11). Two separate etches of layer 20 are performed after its provision. In the first, photoresist is patterned thereover to provide openings therein where openings are desired in that layer for forming electrical connections with structure 17. Reactive ion etching is used to provide openings, 21, in layer 20 to expose layer 16 of structure 17 as shown in FIG. 3D. In the second etching step, photoresist again is provided in a pattern having openings therein where openings, 22, are to be formed in insulation layer 20, and formed in insulation layer 11, and in any other layers in semiconductor chip substrate 10 required to expose interconnection pads, 23, located therein for connection of the bridge circuit with magnetic field sensing structures and interconnect structure 17 to operating circuits connected to pads 23 in the monolithic integrated circuit forming semiconductor chip 10. A portion of a pad 23 is shown in FIG. 3D with the remainder of the interconnection circuitry and the electronic circuits electrically connected thereto in chip 10 not being shown.

After completion of these openings in insulating layer 20, a first layer, 24, for metal interconnections is provided beginning with sputter cleaning to remove approximately half the thickness of the exposed portions of chrome silicon layer 16. This cleaning is followed by sputter depositing a layer of aluminum alloy with 2% copper which fills in openings 21 and 22 but which is otherwise supported on the upper surface of insulator layer 20. Layer 24 is conductively connected to the "sandwich" structure portion of sensing structure 17 through filling in openings 21 so as to be conductively connected thereto through the remaining portions of chrome silicon layer 16 and tantalum layer 15, and is further connected to pads 23 directly through the filling end of openings 22. Photoresist is provided over layer 24 and patterned to expose unwanted portions thereof which portions are subsequently removed by reactive ion etching to result in the desired interconnection structure provided from metal layer 24. Metal interconnection layer 24 is typically deposited in the thickness of 5000 Å. Alternative metals can be used, such as gold or copper or tungsten, for this metal interconnection layer.

The completion of the metal interconnection layer 24 is followed by depositing another layer of silicon nitride thereover, and over the exposed portions of layer 20, to form a further insulating and passivating layer, 35, with a typical thickness of 10,000 Å. Insulator layer 35 serves as a passivation and protection layer for the device structure therebelow, and also serves as a base for a permeable material layer to be provided to serve as a shunt over the central two of the magnetic field sensing structures 17 in FIG. 2A and to also serve as a base for permeable material masses forming flux shields provided over other two of those magnetic field sensing structures 17 in that figure.

Thus, a ferromagnetic thin-film shunt and shield initiation layer, 36, is deposited on layer 35. The portion thereof that is over the central two magnetic field sensing structures positioned side by side in the middle of the structure shown in FIG. 2A will serve as the shunt. The portions of layer 36 which are over the remaining two magnetic field sensing devices 17, each on an opposite side of the central two, serve as electrodes for subsequent electroplating steps and as an adhesion layer for adhering the next layer of shielding metal to be provided thereon to insulator layer 35. Layer 36 is deposited to a thickness of 2000 Å and is formed of 80% iron and 20% nickel. The thickness of this layer can be varied to adjust the shunting effect provided thereby with respect to the two central magnetic field sensing structures in FIG. 2A.

Photoresist is then deposited and patterned to provide openings therein, there being one such opening over each of the portions of layer 36 that are above the two magnetic field sensing structures 17 on either side of the two central ones of these structures. Into these openings there is then electroplated 20,000 Å of gold to serve as stress relief layers, 37, for the permeable material masses to be subsequently deposited thereon as shown in FIG. 3C. The photoresist that was applied after the deposition of the initiation layer is then removed, and a new layer of photoresist is applied defining openings above stress relief layers 37. Permeable masses, 38, are formed in these last openings by electroplating, the masses being formed of a permeable material alloy comprising 80% iron and 20% nickel deposited to a thickness of 14 microns. Layer 38 is shown broken into two portions in FIG. 3C because of its substantially greater thickness than the rest of the layer shown in that figure.

The photoresist used to guide the plating of layer 38 is then removed. The device is dipped in an acid bath formed of a mixture of phosphoric, acidic and nitric acids to remove initiation layer 36 from the portions thereof not under layers 37 and 38. A further layer of photoresist is then deposited on the device with openings therein over the locations desired for interconnection pads, 39, (omitted in FIG. 2A) where via openings, 40, are to be provided in layer 35 to reach metal layer 24. Reactive ion etching is used to provide such openings as seen in FIG. 3E which allow for subsequent interconnections to exterior circuits outside the chip usually through ball bonding wires to pads 39. The resulting permeable mass shields, 41, from layer 38 shown in FIG. 3C are indicated in FIG. 2A as is the shunt structure, 42, from layer 36 as shown in FIG. 3A. The wafers in which the devices like the one just described are fabricated are then ready for wafer testing, separating the individual devices into separate chips and packaging them.

Shunt 42 over the central two of the magnetic field sensing structure 17 in FIG. 2A serves to extend the range of externally applied magnetic fields, between saturation values thereof, in which those shunted sensing structures operate through shunting part of the applied magnetic field by directing such part through the soft magnetic material forming it around those sensing structures. Relatively low fields applied to the sensor will be diverted by shunt 42 of FIG. 2A so that the central two magnetic field sensing structures 17 will experience very little of those fields at lower absolute magnitude values thereof. Shunt 42 of FIG. 2A will saturate at somewhat higher magnitude applied fields so that any further increases in those applied magnetic fields will then begin to affect the sensing structures thereunder.

Figure 4:
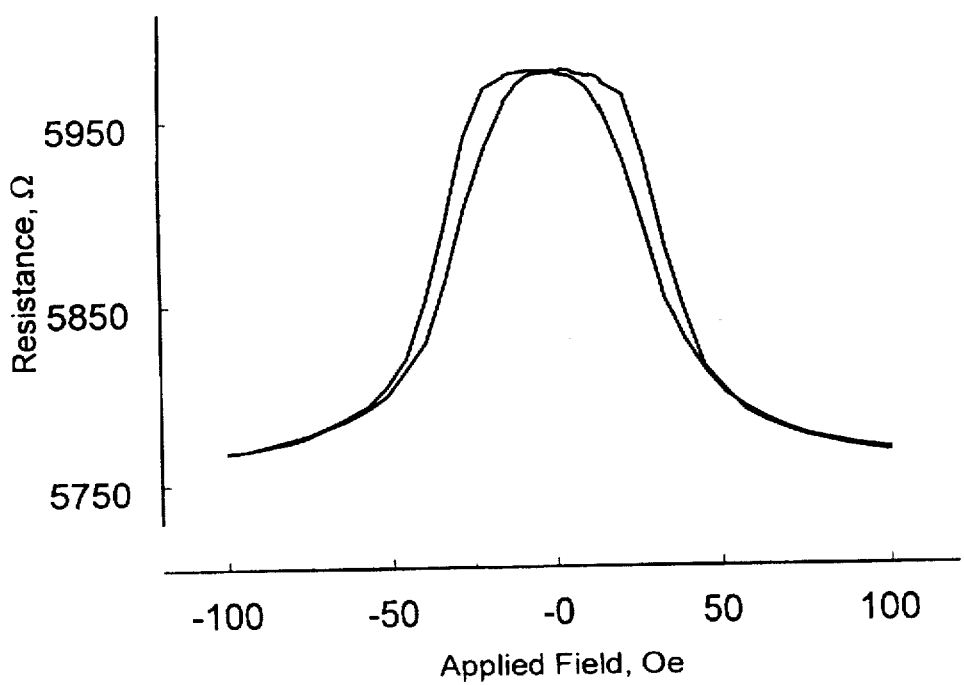
FIG. 4 shows a characteristic of the sensing structure shown in FIG. 2A.

This result can be seen in the resistance versus externally applied magnetic field characteristic shown in FIG. 4 for one of the two magnetic field sensing structures in the sensor of FIG. 2A positioned beneath shunt 42. Externally applied fields with absolute value magnitudes sufficiently small, i.e. sufficiently near zero applied field, cause the resistance of the sensing structure to change very little with changes in the field magnitudes in this range, that is, there is a "dead zone" about zero applied field insofar as the sensing structure responding to variations in the applied field. As the absolute values of the magnitudes of applied fields increase so as to be outside this "dead zone" range, the resistance of the sensing structure will correspondingly begin to decrease until reaching a resistance saturation value corresponding to the magnetic saturation of shunt 42 by the applied field as determined by the geometry of that shunt. One can see comparing the characteristic in FIG. 4 to that of FIG. 1 that the saturation value has been increased by approximately half of the dead zone range as desired. Such a "dead zone" in the characteristic would not be desirable for a linear sensor as indicated above, but is entirely satisfactory for a threshold switching sensor intended to switch when the resistance of the sensing structure reaches a sufficiently low threshold.

Because of the geometrical relationship between the central magnetic field sensing structures 17 and shunt 42 thereover, the field at these sensing structures can be taken to be approximately equal to the demagnetizing field occurring in the shunting structure. Taking the shunting structure to be representable by a rectangular solid, the non-uniform demagnetizing field in the shunt can be determined, and this demagnetizing field will be at a minimum at a location near the center of the shunt. The saturated demagnetizing field there can be represented by the equation:

$$H_{ds} = \frac{2}{\pi} \frac{T}{L} B_s \tan^{-1}\left(\frac{W}{L}\right).$$

In this equation, $H_{ds}$ is the saturated demagnetization field with L, W and T being the length, width and thickness of shunt layer 36. The magnetic saturation induction of the material used in shunt layer 36 is represented by $B_s$. Use of this equation shows that the demagnetizing field at the center is on the order of a few Oersteds as suggested by half the "dead zone" range in the characteristic shown in FIG. 4. Thicker layers will result in a greater saturation demagnetization field occurring in shunt layer 36.

The top side of the central magnetic field sensing structures 17, the side of those sensing structures around which the applied magnetic field is diverted by shunt layer 36, is not the only side of these resistors in which such shunting can be accomplished. Thus, in FIG. 2B, a pair of shunting structures, 43, are shown provided about the outer sides of the central two magnetic field sensing structures 17 (above which they are also elevated because of the fabrication process in which these shunts are formed after sensing structures). Shunting structures 43 are formed in the same manner as are shields 41 and so a layer diagram representation thereof would match that shown in FIG. 3C. Shunting structures 43 are shown on opposite sides of the central two magnetic field sensing structures 17, and are formed continuously along the sides of those sensing structures parallel to the long dimension of the sensor but are separated by gaps along those sides of these structures that are perpendicular to the long dimension of the sensor. As a result, externally applied fields parallel to the long dimension of the sensor will be well shunted about the central two magnetic field sensing structures by shunting structures 43, but fields applied in the opposite direction will not be nearly as well shunted because of the presence of the gaps. The addition of gaps in the existing shunting structures 43 could also reduce the amount of shunting they provide if desired, but all of these gaps needs to be less in length than the distance from one sensing structure to the corresponding sensing structure on the opposite side of the two sensing structures if significant shunting is to be provided.

Figure 2C:
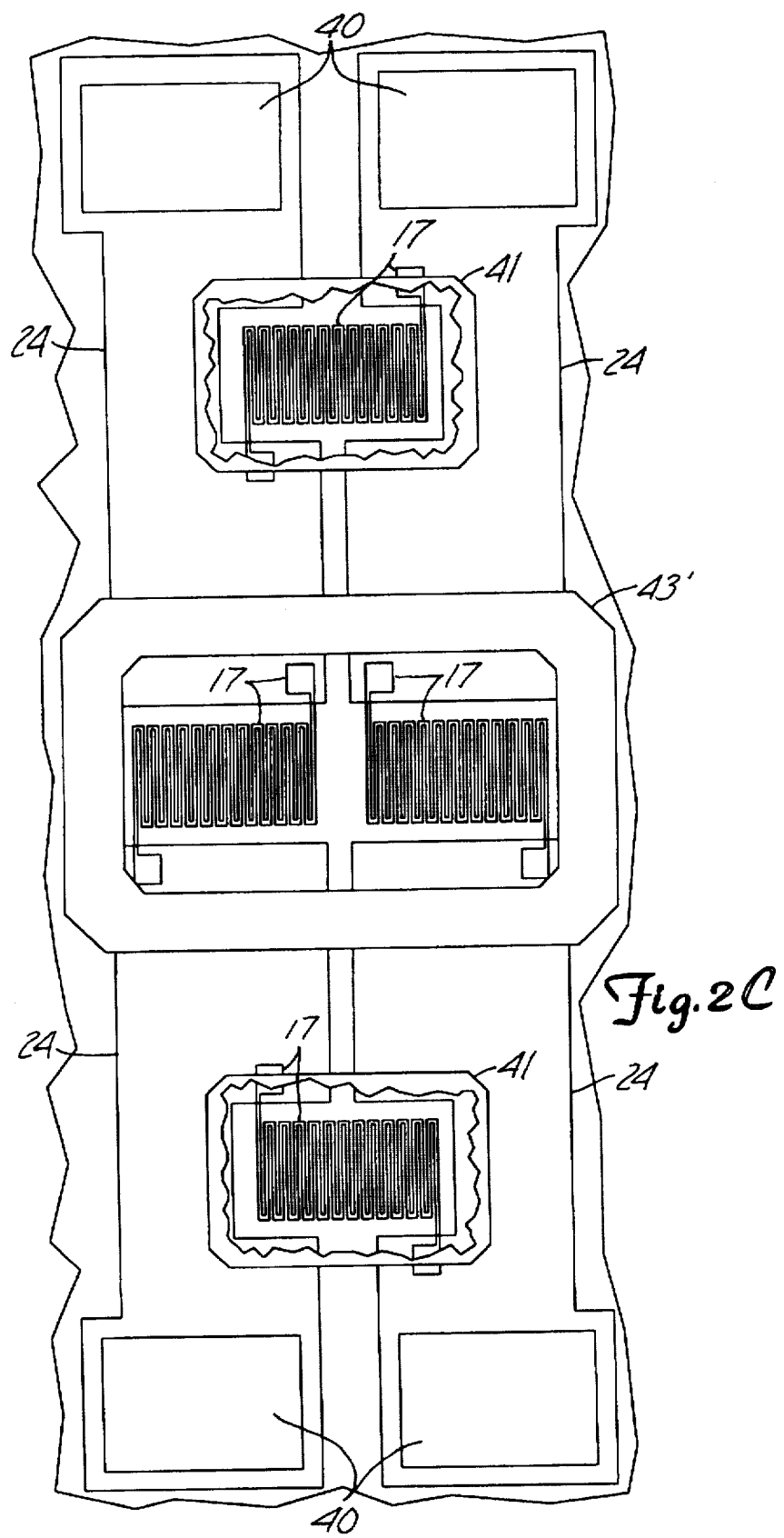

The sensor shown in FIG. 2C shows shunting structures 43 joined together to form a single shunting structure, 43', which is continuous in encircling the central two magnetic sensing structures 17 of that figure. Shunt 43' gives a more symmetrical shunting effect with respect to the direction of the externally applied magnetic fields.

Although the present invention has been described with reference to preferred embodiments, workers skilled in the art will recognize that changes may be made in form and detail without departing from the spirit and scope of the invention.

What is claimed is:

1. A magnetic field sensor comprising:

a substrate having a major surface portion;

a pair of magnetoresistive thin-film layered structures provided on said substrate electrically connected to one another and with each also being electrically connected to an interconnection means suited for electrical connection to a source of electrical energy;

a magnetically permeable shield material mass provided on said substrate having at least a first thickness with one of said pair of electrically connected structures being positioned adjacent to a side of said shield material mass which faces said substrate as supported thereon so as to permit only shielding fractions of magnitudes of at least some external magnetic fields applied to said sensor to affect that one of said pair of electrically connected structures through directing portions of those said externally applied magnetic fields therearound; and a shunt permeable material mass provided adjacent to at least one side of that remaining one of said pair of electrically connected structures so as to permit only shunting fractions of magnitudes of at least some of said external magnetic fields applied to said sensor to affect that said remaining electrically connected structure through directing portions of those said externally applied magnetic fields therearound with said shunting fractions selectively differing from said shielding fraction for said externally applied magnetic fields.

2. The apparatus of claim 1 wherein said shunt material mass is formed as a layer substantially parallelling said substrate which is supported over said substrate with that one of said pair of electrically connected structures adjacent thereto being positioned between said layer and said substrate.

3. The apparatus of claim 1 wherein said shunt material mass is supported directly on said substrate without that one of said pair of electrically connected structures adjacent thereto being positioned between said layer and said substrate.

4. The apparatus of claim 2 wherein said shunt material mass is a portion of a layer having another portion thereof supporting said shield permeable material mass.

5. The apparatus of claim 3 wherein said shunt material mass is one of a pair of magnetically permeable material masses positioned on opposite sides of that one of said pair of electrically connected structures adjacent thereto.

6. The apparatus of claim 3 wherein said shunt material mass is continuous and defines an enclosed space within which said one of said pair of electrically connected structures adjacent thereto is positioned.

7. The apparatus of claim 3 wherein said shunt material mass is one of a plurality of shunting material masses each of a magnetically permeable material positioned about said one of said pair of electrically connected structures adjacent thereto such that members of said plurality of shunting material masses that are adjacent to another are each closer to such adjacent others than to those thereof across that said one of said pair of electrical structures adjacent to said shunt material mass.

8. The apparatus of claim 1 wherein said shunting fractions are substantially greater than said shielding fractions.

9. The apparatus of claim 1 wherein said shunt material mass is a portion of a layer having another portion thereof add said shield material mass.

10. The apparatus of claim 1 wherein said shunt material mass is one of a plurality of shunting masses each of a magnetically permeable material positioned about one of said pair of electrically connected structures adjacent thereto.

* * * * *

UNITED STATES PATENT AND TRADEMARK OFFICE
CERTIFICATE OF CORRECTION

PATENT NO. : 5,729,137
DATED : MARCH 17, 1998
INVENTOR(S) : JAMES M. DAUGHTON, THEODORE M. HERMANN

It is certified that error appears in the above-indentified patent and that said Letters Patent is hereby corrected as shown below:

Col. 4, line 32, delete "pan", insert --part--

Col. 6, line 61, delete "3D", insert --3D)--

Col. 6, line 61, delete "(and", insert --and--

Col. 6, line 62, delete "11).", insert --11.--

Col. 10, line 15, delete "a shunt permeable", insert --a magnetically permeable shunt--

Col. 10, line 38, after "shield", delete "permeable"

Col. 10, line 40, after "permeable", insert --shunt--

Signed and Sealed this

Tenth Day of November 1998

*Attest:*

BRUCE LEHMAN

*Attesting Officer*   *Commissioner of Patents and Trademarks*